(12) United States Patent
Jeffery

(10) Patent No.: US 6,411,129 B1
(45) Date of Patent: Jun. 25, 2002

(54) LOGIC CIRCUIT WITH OUTPUT HIGH VOLTAGE BOOST AND METHOD OF USING

(75) Inventor: Philip A. Jeffery, Tempe, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 18 days.

(21) Appl. No.: 09/677,610

(22) Filed: Oct. 3, 2000

(51) Int. Cl.[7] .................. H03K 19/20; H03K 19/086
(52) U.S. Cl. ...................... 326/126; 327/65; 327/89
(58) Field of Search ................. 326/126, 89, 124; 327/560, 561, 562, 563, 52, 53, 65, 66, 89, 208, 218, 200; 330/252, 288

(56) References Cited

U.S. PATENT DOCUMENTS

| | | | |
|---|---|---|---|
| 5,023,479 A | | 6/1991 | Jeffery et al. ............ 326/109 |
| 5,124,580 A | * | 6/1992 | Matthews et al. ......... 326/126 |
| 5,485,110 A | * | 1/1996 | Jones et al. .............. 326/126 |
| 5,606,272 A | * | 2/1997 | Behbahani et al. ........ 327/65 |
| 6,265,901 B1 | * | 7/2001 | Stern et al. ............... 326/126 |
| 6,292,031 B1 | * | 9/2001 | Thompson et al. ........ 327/66 |

FOREIGN PATENT DOCUMENTS

JP  5-343981  * 12/1993  .................. 326/126

* cited by examiner

Primary Examiner—Tuan T. Lam

(57) ABSTRACT

A differential logic gate providing complimentary input and complimentary output operation. Transistors (50,52) provide the differential input and emitter follower transistors (54,62) provide the complimentary outputs. Enhanced output high logic levels are enabled by PNP transistors (40,46). PNP transistors (40,46) supply base current drive to transistors (54,62) which boosts the output logic high voltage values presented at terminals (Q,Q-compliment) by reducing collector resistor voltage drop across resistors (42,44). PNP transistors (40,46) remain in their respective conductive states due to voltage regulators (38,48) to provide for faster operation.

6 Claims, 3 Drawing Sheets

LOGIC CIRCUIT WITH OUTPUT HIGH VOLTAGE BOOST AND METHOD OF USING

FIELD OF THE INVENTION

The present invention relates, in general, to logic gates and, more particularly, to differential logic gates with improved output logic drive.

BACKGROUND OF THE INVENTION

Differential logic gates have a wide range of applications. Clock generation circuits, for example, provide an excellent application for which differential logic gates can be used. Clock generation circuits implemented with differential logic gates have the capability of significantly reducing the clock skew and jitter over an equivalent design implemented with single-ended logic families. In fact, applications requiring superior noise immunity are especially suited for differential logic implementations. Differential inputs used in differential logic families promote common mode rejection of cross talk noise and EMI radiation.

Semiconductor process improvements tend to shrink the geometric dimensions of semiconductor devices. Speed and power consumption are two examples of motivations for performance enhancements. As newer generations of superior semiconductor devices are manufactured, it is advantageous to replace older logic families with the newer logic generations, which do not dissipate as much energy as the older logic families and yet demonstrate superior speed performance. One problem, however, induced by transplanting the newer logic families into applications utilizing older logic families, is the reduction in current conduction capability of the newer logic families due to increased current densities. As the current density increases, the base-emitter voltage, $V_{be}$, of the newer devices also increase, creating a larger voltage drop across emitter follower output drivers.

Referring to FIG. 1, an enhanced output drive, differential logic circuit 10 is illustrated. Transistor 24 is an emitter follower output driver receiving base current drive from p-type, Metal Oxide Semiconductor (PMOS) device 16. Transistors 18 and 20 form the typical differential logic input, which receive complimentary input logic levels. A logic high voltage at the IN terminal causes transistor 18 to transition to an on, or non-conductive, state which brings the gate terminal of inverting PMOS transistor 16 to a logic low potential. Transistor 16 begins to conduct current, since the base terminal of transistor 24 is substantially equal to $V_{cc}$. Transistor 16 supplies base current drive to the base terminal of transistor 24 only when transistor 20 is in a non-conductive state. In the absence of PMOS transistor 16, the required base current drive would be derived from resistor 14 operating from top rail supply potential $V_{cc}$. The resulting output logic high voltage, $V_{OH}$, would be $V_{OH}=V_{CC}-V_{14}-V_{be-24}$, where $V_{14}$ is the voltage drop across resistor 14 and $V_{be-24}$ is the base-emitter voltage drop across transistor 24. As the logic at terminal IN inverts to a logic low, PMOS transistor 16 turns off, or transitions to a non-conductive state, thereby canceling base current drive into transistor 24. An inherent speed problem exists with differential logic circuit 10, such that PMOS transistor 16 switches on and off depending on the logic state at terminal IN. PMOS transistor switches on during a $V_{OH}$ output condition and switches off during a low output voltage $V_{OL}$ condition. Differential logic circuit 10 also introduces the need to mix MOS technology with bipolar technology, which complicates the semiconductor process and drives the manufacturing costs upward.

A need exists, therefore, for a differential logic gate, which provides improved output logic drive, at faster speeds with reduced manufacturing complexity.

DETAILED DESCRIPTION OF THE DRAWINGS

Figure 1:
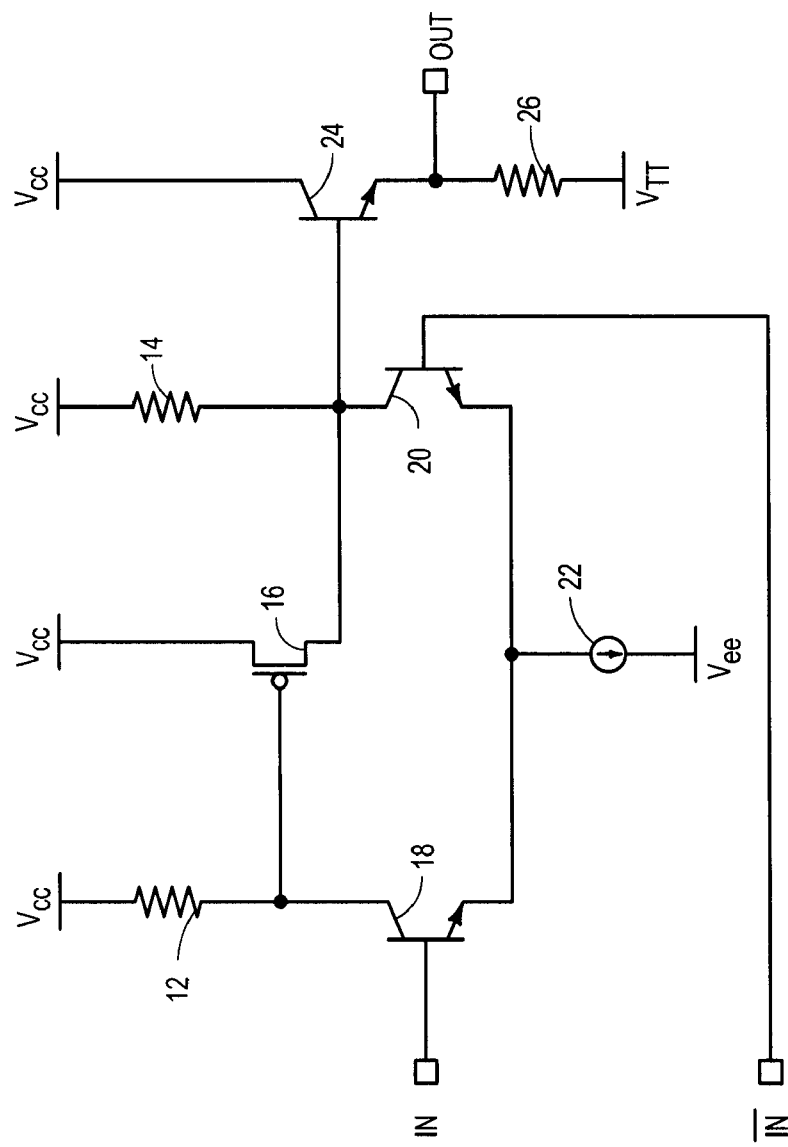
FIG. 1 is a schematic diagram of a prior art differential logic circuit.
Figure 2:
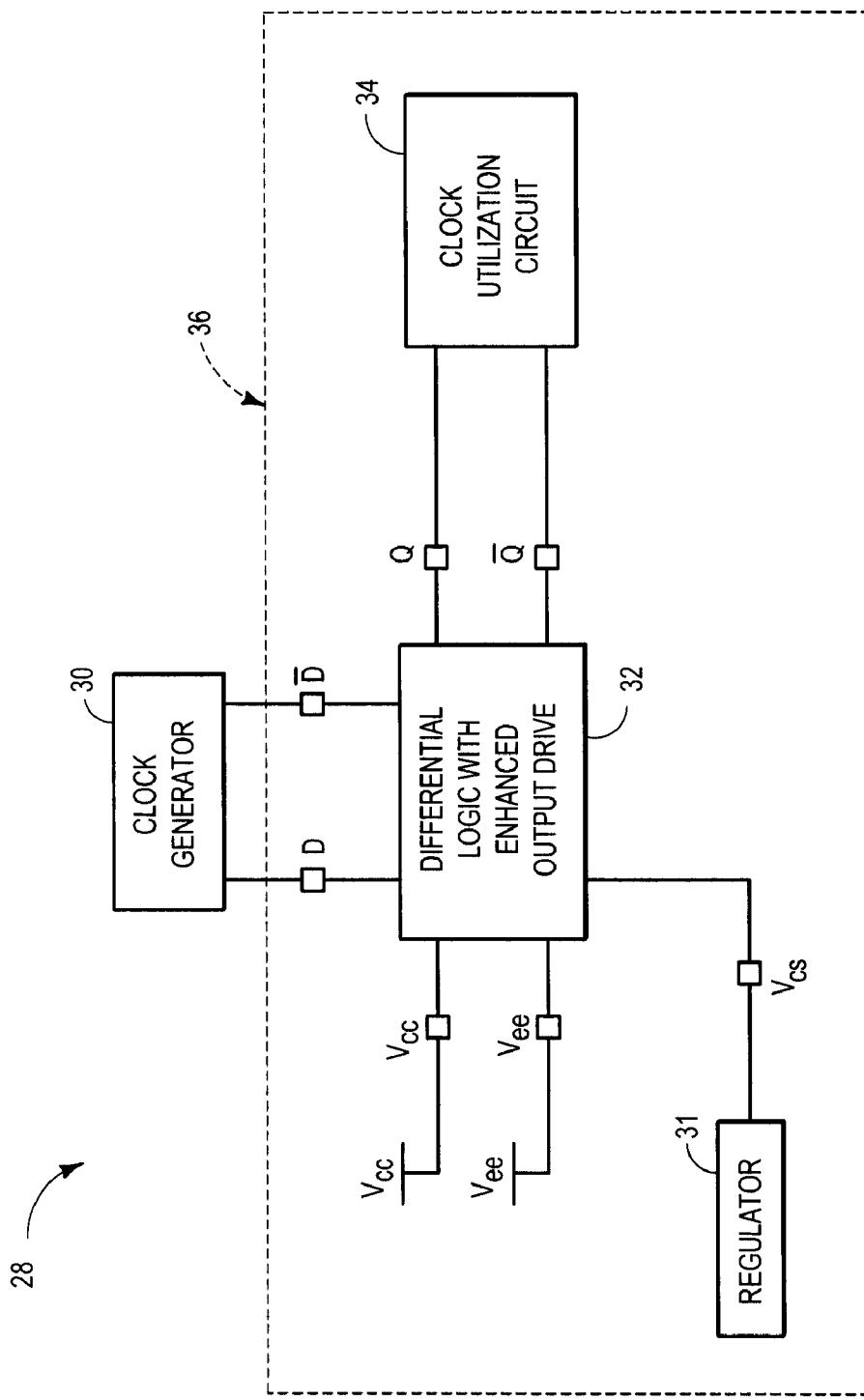
FIG. 2 is a block diagram of a clock distribution network implemented with an enhanced output, differential logic gate.

Referring to FIG. 2, a block diagram of a clock distribution network 28 is shown. Integrated circuit 36 contains an enhanced output, differential logic gate 32, a regulator 31 and a clock utilization circuit 34. The enhanced output, differential logic gate 32 receives a regulated potential $V_{cs}$ from regulator 31 at terminal $V_{cs}$. A differential clock signal is received from external clock generator 30 at terminals D and D-compliment. Enhanced output, differential logic gate 32 provides a differential clock signal exhibiting a $V_{OH}$ at terminals Q and Q-compliment operating closer to top supply rail $V_{cc}$ due to enhanced output drive. FIG. 2 illustrates a single implementation of enhanced output, differential logic gate 32. Many applications, however, exist whereby a multitude of utilization networks may exist on an integrated circuit along with circuit 32.

Figure 3:
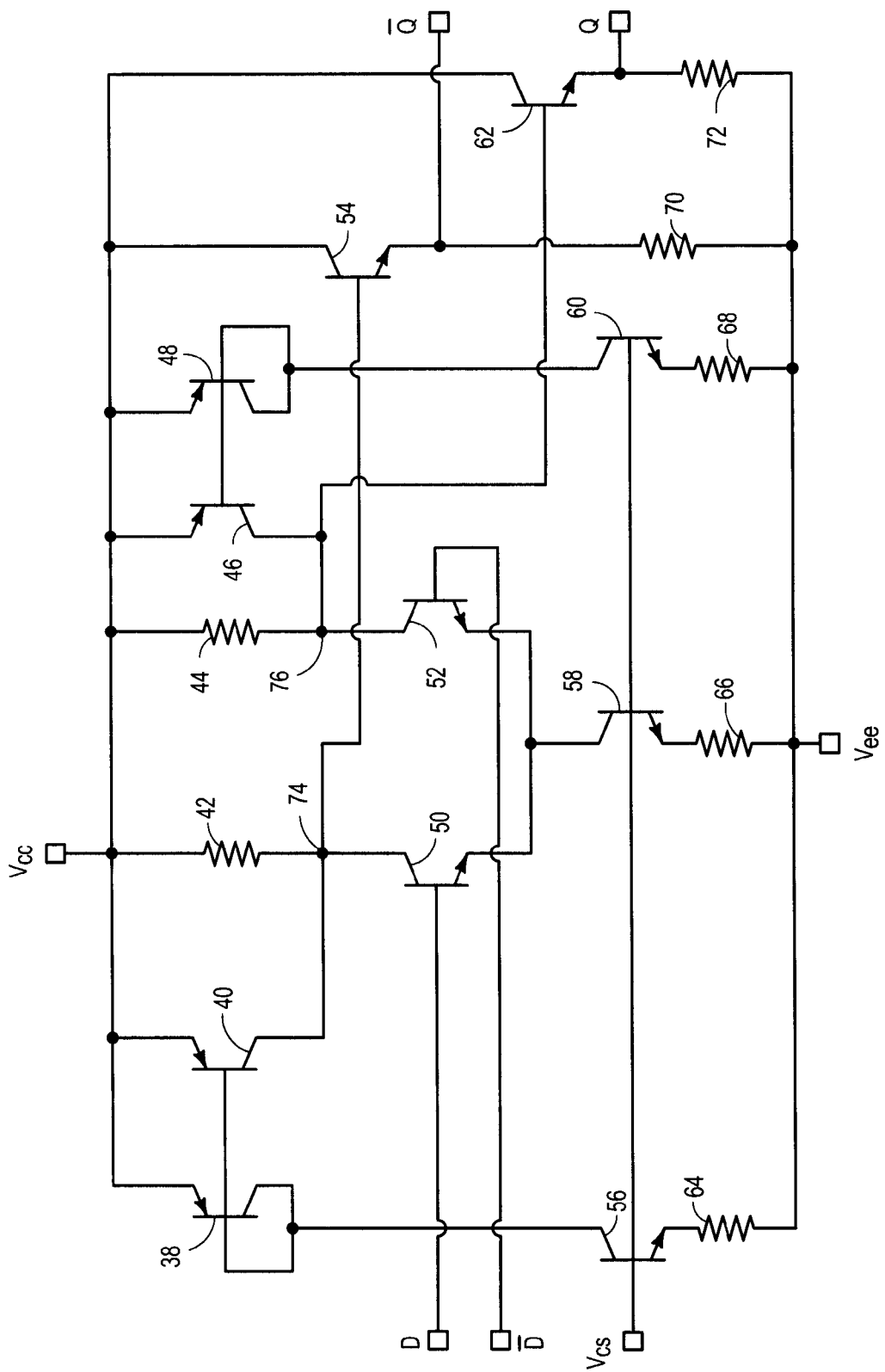
FIG. 3 is a detailed schematic diagram of the enhanced output, differential logic gate of FIG. 2.

FIG. 3 illustrates a detailed schematic of the enhanced output, differential logic gate 32. The base terminals of transistors 50 and 52 are coupled to terminals D and D-compliment, respectively. Transistors 50 and 52 comprise the input stage of enhanced output, differential logic gate 32. The emitter terminals of transistors 50 and 52 are coupled together to the collector terminal of transistor 58. The emitter terminal of transistor 58 is coupled to a first terminal of resistor 66. The second terminal of resistor 66 is coupled to the bottom rail voltage supply $V_{ee}$. The collector terminals of transistors 50 and 52 are coupled to the first terminals of resistors 42 and 44 at nodes 74 and 76, respectively. The second terminals of resistors 42 and 44 are coupled to the top rail voltage supply $V_{cc}$. The base terminals of transistors 50 and 52 are coupled to the input terminals D and D-compliment, respectively. PNP transistor 38 is diode coupled whereby the collector terminal of transistor 38 is coupled to the base terminal of transistor 38 and to the collector terminal of transistor 56. The emitter terminal of transistor 38 is coupled to the top rail supply voltage $V_{cc}$. The emitter terminal of transistor 56 is coupled to the first terminal of resistor 64 and the base terminal of transistor 56 is coupled to the $V_{cs}$ terminal. The second terminal of resistor 64 is coupled to the bottom rail supply voltage $V_{ee}$.

The base terminal of PNP transistor 40 is coupled to the base terminal of PNP transistor 38. The emitter terminal of transistor 40 is coupled to the top rail supply voltage $V_{cc}$ and the collector terminal of transistor 40 is coupled to the base terminal of transistor 54 at node 74. PNP transistor 48 is diode connected such that the collector terminal of transistor 48 is coupled to the base terminal of transistor 48 and to the collector terminal of transistor 60. The emitter terminal of transistor 48 is coupled to the top rail supply voltage $V_{cc}$ and the base terminal of transistor 48 is coupled to the base terminal of PNP transistor 46. The emitter terminal of transistor 46 is coupled to the top rail supply voltage $V_{cc}$ and the collector terminal of transistor 46 is coupled to the base terminal of transistor 62 at node 76. The base terminal of transistor 60 is coupled to the base terminal of transistor 58. The emitter terminal of transistor 60 is coupled to the first terminal of resistor 68 and the second terminal of resistor 68 is coupled to the bottom rail supply voltage $V_{ee}$. Transistors 54 and 62 are emitter follower transistors whose base terminals are coupled to nodes 74 and 76, respectively. Transistors 54 and 62 comprise the output stage of enhanced output, differential logic gate 32. Enhanced output voltage is delivered by the enhanced output stage at the respective emitter terminals of emitter follower transistors 54 and 62. The collector terminals of transistors 54 and 62 are coupled to the top rail supply voltage $V_{cc}$. The emitter terminal of transistor 54 is coupled to the first terminal of resistor 70 and the emitter terminal of transistor 62 is coupled to the first terminal of resistor 72. The second terminals of resistors 70 and 72 are coupled to the bottom rail supply voltage $V_{ee}$. The outputs of enhanced output, differential logic gate 32, Q and Q-compliment, are derived at the emitter terminals of transistors 62 and 54, respectively.

In operation, circuit 32 receives complimentary input logic at terminals D and D-compliment and provides complimentary output logic at terminals Q and Q-compliment. A logic high presented at terminal D requires that a logic low also be presented at terminal D-compliment. A logic high presented at terminal D places transistor 50 into an on, or conductive, state, whereas a logic low at terminal D-compliment places transistor 52 into an off, or non-conductive, state. A conductive state for transistor 50 places node 74 at a logic low potential, which subsequently places transistor 54 into reduced conductive state. Low current is subsequently conducted by transistor 54, providing for a low voltage drop across resistor 70, which places terminal Q at a logic low state. Conversely, a logic low presented at terminal D-compliment, places transistor 52 into an off, or non-conductive, state. A non-conductive state for transistor 52 provides no current conduction and therefore no voltage drop across resistor 44. No voltage drop across resistor 44 places node 76 at a logic high state, which places transistor 62 into an elevated conductive state. Terminal Q is then subsequently placed at a logic high state.

A logic high presented at terminal D-compliment places transistor 52 into an on, or conductive, state, whereas a logic low at terminal D places transistor 50 into an off, or non-conductive, state. A conductive state for transistor 52 places node 76 at a logic low potential, which subsequently places transistor 62 into a reduced conductive state. Low current is conducted by transistor 62, providing for a low voltage drop across resistor 72, which places terminal Q at a logic low state. Conversely, a logic low presented at terminal D, places transistor 50 into an off, or non-conductive, state. A non-conductive state for transistor 50 provides no current conduction and therefore no voltage drop across resistor 42. No voltage drop across resistor 42 places node 74 at a logic high state, which places transistor 54 into an elevated conductive state. Terminal Q-compliment is subsequently placed at a logic high state.

A logic high at terminal Q signifies that transistor 62 is in an elevated conductive state. Transistor 62 supplies emitter current in relation to the base current drive and beta, or current gain, of transistor 62. The emitter current of transistor 62 is characterized by $I_{E-62} = \beta_{62} * I_{B-62}$, where $\beta_{62}$ is the current gain of transistor 62 and $I_{B-62}$ is the base current of transistor 62. In the absence of PNP transistor 46, the base current drive into transistor 62 would normally be provided by the current conducted by resistor 44. Base current drive provided by resistor 44 would provide for an output high voltage at terminal Q given by $V_{OH-Q} = V_{cc} - V_{44} - V_{be-62}$, where $V_{44}$ is the voltage drop across resistor 44 and $V_{be-62}$ is the base-emitter voltage across transistor 62. In the absence of PNP transistor 40, the base current drive into transistor 54 would normally be provided by the current conducted by resistor 42. Base current drive provided by resistor 42 would provide for an output high voltage at terminal Q-compliment given by $V_{OH-Q}$ -compliment $=V_{cc}$ $V_{42}$ $V_{be-54}$, where $V_{42}$ is the voltage drop across resistor 42 and $V_{be-54}$ is the base-emitter voltage across transistor 54. The additional voltage terms represented by $V_{44}$ and $V_{42}$ subtract from the $V_{OH}$ voltages at terminals Q and Q-compliment, respectively, possibly lowering the voltage levels below acceptable specification.

A significant advantage is therefore demonstrated by output enhanced, differential logic gate 32 when a logic high is presented at either terminal Q or Q-compliment, due to the presence of PNP transistors 46 and 40, respectively. Transistors 40 and 46 comprise the output boost stage of enhanced output, differential logic gate 32. Base current drive for transistor 54 is substantially supplied by PNP transistor 40, when transistor 54 is in an on, or conductive, state. Transistor 40 is always on, or in a conductive state, due to the base voltage bias supplied to transistor 40. A regulated, reference voltage is supplied to the base terminal of transistor 40, by diode connected PNP transistor 38. A constant current source, transistor 56, provides current to voltage reference 38, in order to maintain a constant current flow from the collector terminal of transistor 40. The output high voltage at terminal Q-compliment with boost is therefore given by $V_{OHboost-Q-compliment} = V_{cc} - V_{be-54}$. $V_{OHboost-Q-compliment}$ is a voltage significantly higher than the output high voltage delivered in the absence of PNP transistor 40.

Likewise, base current drive for transistor 62 is substantially supplied by PNP transistor 46, when transistor 62 is in an on, or conductive, state. Transistor 46 is always on, or in a conductive state, due to the base voltage bias supplied to transistor 46. A regulated, reference voltage is supplied to the base terminal of transistor 46, by diode connected PNP transistor 48. A constant current source, transistor 60, provides current to voltage reference 48, in order to maintain a constant current flow from transistor 46. The output high voltage with boost at terminal Q is therefore given by $V_{OHboost-Q} = V_{cc} - V_{be-62}$. $V_{OHboost-Q}$ is a voltage significantly higher than the output high voltage delivered in the absence of PNP transistor 46.

It should be noted that PNP transistors 40 and 46 supply current to the base terminals of transistors 54 and 62, respectively, even though the voltage at the base terminal of transistors 54 and 62 is substantially equal to the top rail supply voltage. In particular, transistor 54 requires base current drive from transistor 40 when transistor 54 is in an elevated conductive state, delivering an output logic high voltage. The emitter terminal of transistor 40, however, is at the same potential as the collector terminal of transistor 54, which requires transistor 40 to be PNP type. Similarly, transistor 62 requires base current drive from transistor 46 when transistor 62 is in an elevated conductive state, delivering an output logic high voltage. The emitter terminal of transistor 46, however, is at the same potential as the collector terminal of transistor 62, which requires transistor 46 to be PNP type.

A second advantage demonstrated by output enhanced, differential logic gate 32, is the speed of operation. Since PNP transistors 40 and 46 are maintained in their respective conductive states, switching times for transistors 40 and 46 do not factor into the overall propagation delay of circuit 32. Base current drive into transistors 54 and 62 can be supplied by transistors 40 and 46, respectively, in significantly less time than would be necessary if transistors 40 and 46 were required to be switched on, in order to supply base drive current.

A third advantage of output enhanced, differential logic gate 32 is demonstrated since bipolar and MOS technologies need not be mixed. Circuit 32 provides for an exclusively bipolar solution, which significantly reduces process complexity and cost of manufacture.

By now it should be appreciated that an enhanced output, differential logic gate has been presented. Additional base current drive, is supplied by PNP transistors, to emitter follower transistors, in order to boost the output high logic voltage. The PNP transistors are kept in a conductive state, which provides for faster operation. In addition, a completely bipolar solution has been presented which precludes the use of mixed MOS and bipolar technologies, significantly reducing the complexity and costs of the manufacturing process.

What is claimed is:

1. An enhanced differential logic gate, comprising:

a differential output boost stage having control inputs coupled to receive first and second regulated voltages and having first and second outputs coupled to provide first and second continuous output boost signals substantially operating at a first supply voltage, wherein the differential output boost stage comprises:

a first amplifier having a voltage supply terminal coupled to receive the supply voltage, an input terminal coupled to receive the first regulated voltage and an output terminal coupled to provide the first continuous output boost signal, and a second amplifier having a voltage supply terminal coupled to receive the supply voltage an input terminal coupled to receive the second regulated voltage and an output terminal coupled to provide the second continuous output boost signal; and a differential output stage having control inputs coupled to receive the first and second continuous output boost signals wherein the control inputs are substantially operating at the supply voltage and coupled to provide first and second enhanced output signals.

2. The enhanced differential logic gate of claim 1 wherein the first amplifier includes a transistor having a first conduction terminal coupled to receive the supply voltage, a second conduction terminal coupled to provide the first continuous output boost signal and a control terminal coupled to receive the first regulated voltage.

3. The enhanced differential logic gate of claim 2 wherein the transistor is PNP type.

4. The enhanced differential logic gate of claim 1 wherein the second amplifier includes a transistor having a first conduction terminal coupled to receive the supply voltage, a second conduction terminal coupled to provide the second continuous output boost signal and a control terminal coupled to receive the second regulated voltage.

5. The enhanced differential logic gate of claim 4 wherein the transistor is PNP type.

6. The enhanced differential logic gate of claim 1 wherein the differential output stage comprises:

a first emitter follower amplifier having a first conduction terminal coupled to receive the supply voltage, a control terminal coupled to receive the first continuous output boost signal and a second conduction terminal coupled to provide a first enhanced output signal; and a second emitter follower amplifier having a first conduction terminal coupled to receive the supply voltage, a control terminal coupled to receive the second continuous output boost signal and a second conduction terminal coupled to provide a second enhanced output signal.

* * * * *